(12) United States Patent
Li et al.

(10) Patent No.: US 11,038,340 B2
(45) Date of Patent: Jun. 15, 2021

(54) SOFT-STARTER AC-AC CONVERTER WITH INTEGRATED SOLID-STATE CIRCUIT BREAKER AND METHOD OF OPERATION THEREOF

(71) Applicant: Eaton Intelligent Power Limited, Dublin (IE)

(72) Inventors: Huaqiang Li, Menomonee Falls, WI (US); Kaijam M. Woodley, Brown Deer, WI (US)

(73) Assignee: Eaton Intelligent Power Limited, Dublin (IE)

( * ) Notice: Subject to any disclaimer, the term of this patent is extended or adjusted under 35 U.S.C. 154(b) by 265 days.

(21) Appl. No.: 15/711,152

(22) Filed: Sep. 21, 2017

(65) Prior Publication Data
US 2019/0089146 A1    Mar. 21, 2019

(51) Int. Cl.
*H02H 7/085*     (2006.01)
*H02H 7/08*     (2006.01)
(Continued)

(52) U.S. Cl.
CPC ........ *H02H 7/0855* (2013.01); *H02H 7/0816* (2013.01); *H02H 7/0822* (2013.01); *H02H 7/0833* (2013.01); *H02H 7/0858* (2013.01); *H02H 7/09* (2013.01); *H02H 7/1216* (2013.01); *H02H 9/002* (2013.01); *H02H 9/005* (2013.01);
(Continued)

(58) Field of Classification Search
CPC .. H02P 2201/01; H02P 2201/03; H02P 25/16; H02M 5/00; H02M 5/257; H02M 5/25; H02M 5/2573; H02M 5/2576; H02M 5/275; H02M 5/293; H02M 5/458; H02M 2001/0058; H02H 7/0855; H02H 7/1216; H02H 7/0858; H02H 7/0816;
(Continued)

(56) References Cited

U.S. PATENT DOCUMENTS

| 5,923,143 A | 7/1999 | Cosan et al. |
| 6,771,056 B1 | 8/2004 | Lindemann |

(Continued)

OTHER PUBLICATIONS

S811+ Soft Starter, User Manual, Nov. 2012, Eaton, pp. 1-100.

*Primary Examiner* — Bickey Dhakal
(74) *Attorney, Agent, or Firm* — DiBerardino McGovern IP Group LLC (57) ABSTRACT

An AC-AC power converter, such as a motor soft starter, includes an input connectable to an AC source with a disconnect switch, an output connectable to an AC load, and phase lines connecting the input and output to transmit power. In-line solid-state switching blocks are connected between line terminals and load terminals of the AC source and AC load, respectively, such that each phase line includes a solid-state switching block connected thereto. Free-wheeling solid-state switching blocks are connected to the load terminals at one end and together at a common connection at another end, such that each phase line includes a free-wheeling solid-state switching block connected thereto. Each of the in-line and free-wheeling solid-state switching blocks comprises a bi-directional switching block that selectively controls current and withstands voltage in both directions. The switching blocks also provide soft-starter functions, variable speed control, and integrated circuit breaker protection capability.

17 Claims, 9 Drawing Sheets

(51) Int. Cl.
*H02M 5/293* (2006.01)
*H02P 25/16* (2006.01)
*H02H 9/00* (2006.01)
*H02H 7/09* (2006.01)
*H03K 17/687* (2006.01)
*H03K 17/567* (2006.01)
*H02P 1/28* (2006.01)
*H02H 7/12* (2006.01)
*H02M 1/00* (2006.01)

(52) U.S. Cl.
CPC .............. *H02M 5/293* (2013.01); *H02P 1/28* (2013.01); *H02P 25/16* (2013.01); *H03K 17/567* (2013.01); *H03K 17/6871* (2013.01); *H02H 7/08* (2013.01); *H02M 2001/0058* (2013.01); *H02M 2005/2932* (2013.01); *H02M 2005/2935* (2013.01); *H03K 2217/0009* (2013.01)

(58) Field of Classification Search
CPC .... H02H 7/0822; H02H 7/0833; H02H 9/005; H02H 7/09; H03K 17/567
See application file for complete search history.

(56) References Cited

U.S. PATENT DOCUMENTS

| | | | |
|---|---|---|---|
| 9,425,702 | B2 | 8/2016 | Lequesne et al. |
| 2007/0217243 | A1* | 9/2007 | Yamamoto ............ H02M 5/293 363/160 |
| 2008/0130183 | A1* | 6/2008 | Kawashima .......... H02M 5/458 361/79 |
| 2011/0199068 | A1 | 8/2011 | Rinaldi |
| 2014/0184190 | A1* | 7/2014 | Jankovic ................... H02P 1/42 323/311 |
| 2015/0115906 | A1* | 4/2015 | Ebisu ..................... H02M 1/00 323/217 |
| 2015/0333685 | A1* | 11/2015 | Wei .......................... H02P 1/16 318/430 |

\* cited by examiner

$\bar{u}>0, i_o>0: S_1$ CHARGING, $S_3$ FREEWHEELING $\bar{u}>0, i_o<0: S_4$ CHARGING, $S_2$ FREEWHEELING $\bar{u}<0, i_o>0: S_3$ CHARGING, $S_1$ FREEWHEELING $\bar{u}<0, i_o<0: S_2$ CHARGING, $S_4$ FREEWHEELING

SOFT-STARTER AC-AC CONVERTER WITH INTEGRATED SOLID-STATE CIRCUIT BREAKER AND METHOD OF OPERATION THEREOF

BACKGROUND OF THE INVENTION

The present invention relates generally to AC-AC power conversion circuits and, more particularly, to a soft-starter AC-AC power conversion circuit having a solid-state circuit breaker integrated therein and method of operation thereof.

AC-AC converters function to convert an AC voltage to another AC voltage. One type of AC-AC converters commonly used in industry are soft starters, which are industrial control devices that make it possible to start AC induction motors smoothly, with a reduced inrush current, by controlling transmission of voltage and current from an AC power source to the induction motor. Soft starters are configured to limit the transient voltages and current to the induction motor during start-up, resulting in a "soft" motor starting. In operation, power from the AC source is passed through switching devices in the soft starter, such as a pair of anti-parallel solid-state switches in the form of thyristors or silicon controlled rectifiers (SCRs), to control the current flow and, in turn, the terminal voltages of the induction motor.

In general, the soft starter temporarily reduces load and torque in a powertrain of the motor during startup. This reduction allows for reduced stresses on the motor and electrical network, which increases the life of the system. The soft starter or motor drive allows for reducing the voltage or current input to the motor via selective control of the thyristors, with the thyristors being controlled to turn on at a given angle, as measured when the voltage becomes positive. The resulting currents flow through the given phases until they reach zero, at which point the thyristors turn off. This pattern creates a "notch" in the voltage. The larger the notch width, the smaller the rms voltage applied to the motor. Since torque is a function of the square of the rms voltage, the larger the notch width, the smaller the torque. If the notch width is zero, full voltage is applied to the motor. Typically, the soft starting process lasts a few seconds, at the end of which the system reaches its final speed and contactors are closed to bypass the soft starter.

In employing a soft-starter (or other AC-AC converter) in the field, it is recognized that a protective device such as a circuit breaker component is required to provide protection to the soft-starter power distribution system. The present industry practice for providing such protection is to include an upstream electromechanical circuit breaker external to the soft-starter. In the event of a fault condition either external to or within the soft-starter, the circuit breaker functions to protect the soft-starter power distribution system by interrupting current flow therethrough. However, it is recognized that traditional electromechanical circuit breakers have a finite response time and may let through energy from the source to the soft-starter when a fault condition is present. Accordingly, even with the presence of a circuit breaker, it is possible that damage to the soft-starter may occur due to overstressed components therein (e.g., SCRs), as the additional energy that flows to the soft-starter during the circuit breaker response time may be enough to cause such component failure.

More recently, solid-state circuit breakers have been developed to replace traditional circuit breakers, with such solid-state circuit breakers beneficially having a shorter response time as compared to traditional circuit breakers. However, it is recognized that use of solid-state circuit breakers for providing protection to a soft-starter still does not provide an optimal solution. That is, as the solid-state circuit breaker is still external to the soft-starter, it adds cost, cabling and connections, extra space and weight. Additionally, existing solid-state circuit breakers may not provide protection at higher current levels, such as might occur with inrush current that is present during start-up of the motor/load, as the solid-state switches in the breaker are always fully gated On and may experience overlong thermal stresses. Accordingly, the solid-state circuit breaker may not be suitable to protect against inrush currents when soft-starter is not used, which may be 6-7× higher than the rated current and can last for many seconds.

As described above, it is recognized that existing circuit breaker designs external to the soft-starter—whether traditional electro-mechanical switch breakers or solid-state breakers—either fail to provide adequate and comprehensive protection to the soft-starter under a short circuit condition (when using electro-mechanical circuit breakers), or are too costly to implement (for solid state circuit breakers). Furthermore, it is recognized that the architecture of the soft-starter using SCRs itself lacks the means to provide sufficient protection against a fault condition. That is, controlling of a fault current condition in the soft-starter is not possible, as the arrangement of thyristors/SCRs typically found in soft-starters cannot be controlled to terminate power flow through the soft-starter during a fault condition such as a short circuit.

It would therefore be desirable to provide a system and method for protecting a soft-starter upon occurrence of a fault internal or external to the soft-starter.

BRIEF DESCRIPTION OF THE INVENTION

Embodiments of the invention are directed to a soft starter AC-AC converter with an integrated solid-state circuit breaker and method of operation thereof. The AC-AC converter and integrated solid-state circuit breaker removes the need for installing an external circuit breaker, achieving system flexibility, providing increased protection, and reducing total cost of ownership.

In accordance with one aspect of the invention, an AC-AC power converter includes an input connectable to line terminals of an AC source, an output connectable to load terminals of an AC load, and one or more supply lines connecting the input and output to transmit power from the AC source to the AC load, each supply line corresponding to a phase in the AC load. The AC-AC power converter also includes a plurality of in-line solid-state switching blocks connected between the line terminals and the load terminals, such that each supply line includes a respective one of the plurality of in-line solid-state switching blocks connected thereto, and a plurality of free-wheeling solid-state switching blocks connected to the load terminals at one end and together at a common connection at another end, such that each supply line includes a respective one of the plurality of free-wheeling solid-state switching blocks connected thereto, wherein each of the plurality of in-line solid-state switching blocks and each of the plurality of free-wheeling solid-state switching blocks comprises a bi-directional switching block that selectively controls current and withstands voltage in both directions.

In accordance with another aspect of the invention, an AC-AC power converter includes an input connectable to line terminals of an AC source, an output connectable to load terminals of an AC load, and one or more supply lines connecting the input and output to transmit power from the AC source to the AC load, each supply line corresponding to a phase in the AC load. The AC-AC power converter also includes a plurality of solid-state switching blocks each including an arrangement of solid-state switches, with or without accompanying diodes, that form a bi-directional switching block that controls current and withstands voltage in both directions. The AC-AC power converter further includes a controller operatively connected to each of the plurality of solid-state switching blocks, the controller programmed to selectively switch the solid-state switches in the plurality of solid-state switching blocks between conducting and non-conducting states to enable full speed operation of the AC load, soft-starting of the AC load at a voltage less than a full speed operation voltage, and selective interruption of current flow through the AC-AC power converter in a circuit breaker function.

In accordance with yet another aspect of the invention, a method of operating an AC-AC power converter includes receiving an AC power at an input of the AC-AC power converter and comparing, via a controller, one or more current and voltage parameters of power provided to the AC-AC power converter or present in the AC-AC power converter and acquired by one or more voltage or current sensors, to one or more respective current and voltage thresholds. The method also includes identifying, via the controller, a fault condition in the AC-AC power converter if the one or more measured or determined current and voltage parameters exceed the one or more respective current and voltage thresholds and controlling, via the controller, a solid-state circuit breaker integrated into the AC-AC power converter to interrupt current flow through the AC-AC power converter upon identification of the fault condition, the solid-state circuit breaker comprising a plurality of solid-state switching blocks connected between line terminals and load terminals of the AC-AC power converter, with each of the solid-state switching blocks including a pair of solid-state switches connected with one another in anti-series and a pair of diodes each connected in anti-parallel with the pair of solid-state switches, with the pair of diodes further connected in anti-series with one another. In controlling the solid-state circuit breaker to interrupt current flow, the method further includes switching each of the pair of solid-state switches in each respective solid-state switching block to a non-conducting Off state, so as to interrupt current flow through the AC-AC power converter.

Various other features and advantages of the present invention will be made apparent from the following detailed description and the drawings.

BRIEF DESCRIPTION OF THE DRAWINGS

The drawings illustrate preferred embodiments presently contemplated for carrying out the invention.

In the drawings.

DETAILED DESCRIPTION

Embodiments of the invention relate to a system and method for preventing component failure and damage in an AC-AC power converter, such as a soft-starter, responsive to a fault condition, either in steady state or in transient form, and protecting feeder conductors. A solid-state circuit breaker is integrated into the AC-AC power converter to provide protection thereto, with the solid-state circuit breaker interrupting a fault current in the AC-AC power converter upon detection of a fault condition so as to limit the damage to components in the AC-AC power converter. The arrangement of solid-state devices in the AC-AC power converter also provides for bi-directional power flow control through the soft-starter.

Figure 1:
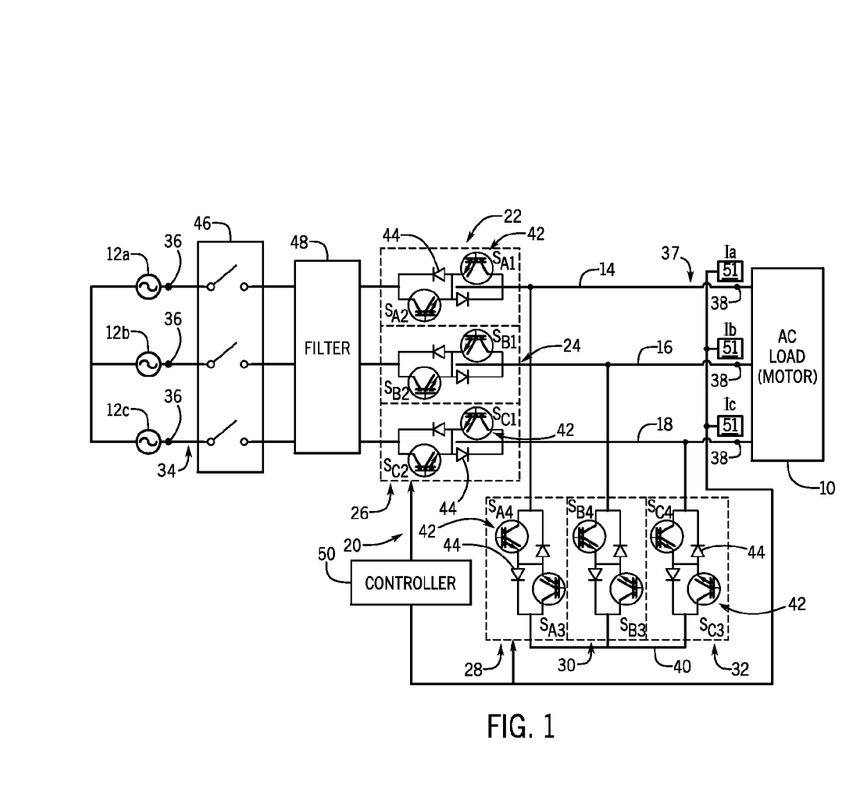
FIG. 1 is a schematic diagram of a soft-starter with an integrated solid-state circuit breaker, according to an embodiment of the invention.

Referring to FIG. 1, a three-phase, AC load 10, which can be a motor or non-motor load, is shown for use with embodiments of the invention. According to one embodiment, the AC load 10 comprises an induction motor where power is supplied from the stator to the rotor (not shown) thereof by means of electromagnetic induction, with the AC load 10 being operatively connected to a three-phase AC source 12*a*-12*c* through corresponding supply lines 14, 16 and 18, respectively, so as to receive power therefrom. Thus, for purposes of reference, supply line 14 corresponds to a Phase A, supply line 16 corresponds to a Phase B, and supply line 18 corresponds to a Phase C. As shown in FIG. 1, a motor control device 20 is connected between AC source 12*a*-12*c* and AC load 10 that performs an AC-AC conversion of the AC waveform generated by AC source 12*a*-12*c* to another AC waveform for input to the AC load 10. In an exemplary embodiment of the invention, motor control device 20 comprises a soft-starter configured to limit the inrush current to AC load 10 during start-up, resulting in a "soft" motor start that avoids inrush currents, and thus the motor control device is hereafter referred to as a soft-starter—but generally speaking, control device 20 uses a 3-phase AC supply voltage as input and provides a controlled AC voltage or current to the load. It is therefore recognized that embodiments of the invention are not limited to soft-starter applications and may be incorporated into other motor control devices such as AC motor drives or AC generator drives, and more generally to AC-AC power conversion circuits of varying constructions and implementations for driving motor or non-motor loads. Accordingly, the following discussion of the integration of a solid-state circuit breaker into a soft-starter is not meant to limit the scope of the invention.

The basic structure of soft-starter 20 is shown in FIG. 1 (i.e., circuitry 21 of the soft-starter) as including a plurality of solid-state switching blocks 22, 24, 26, 28, 30, 32 connected to supply lines 14, 16, 18, with each of the switching blocks having a bidirectional control, so as to control the current flow and, in turn, the terminal voltages of the AC load 10 such that the plurality of switching blocks collectively provide or form a solid-state circuit breaker that is integrated into the soft-starter. According to an exemplary embodiment of the invention, an arrangement of six switching blocks 22, 24, 26, 28, 30, 32 is provided in the soft-starter. An input 34 of soft-starter 20 is connected to a line terminal(s) 36 of AC source 12a-12c and an output 37 of soft-starter 20 is connected to a load terminal(s) 38 of AC load 10. Three switching blocks 22, 24, 26 are connected between the line terminals 36 of AC source 12a-12c and the load terminals 38 of AC load 10, with these switching blocks referred to hereafter as in-line switching blocks. Three other switching blocks 28, 30, 32 that are referred to herein as free-wheeling switching blocks are connected to the load terminals 38 at one end and together at a common connection 40 at the other end. As shown in FIG. 1, six switching blocks are provided corresponding to the number of phases (i.e., three phases), with one of the in-line switching blocks and one of the free-wheeling switching blocks being provided per phase. It is recognized, however, that any number of phases can be envisioned and thus embodiments of the invention can be readily extended from a 3-phase example.

As shown in the embodiment of FIG. 1, each switching block 22, 24, 26, 28, 30, 32 includes a pair of unidirectionally conducting solid-state semiconductor switches 42 and a pair of diodes 44. According to an exemplary embodiment of the invention, the solid-state semiconductor switches 42 are in the form of insulated-gate bipolar transistor (IGBTs), and thus the switches are hereafter referred to generally as IGBTs. However, it is noted that "IGBT" should be understood as any solid-state semiconductor switch that can be turned On and Off at will (at any frequency including high frequencies in the tens of kHz and beyond), and it is recognized that other solid-state semiconductor switches could be used instead, including metal oxide semiconductor field effect transistors (MOSFETs) or integrated gate-commutated thyristors (IGCTs), for example, although other solid-state semiconductor switches may also be suitable, and thus embodiments of the invention are not meant to be limited to the specific switch types set forth above. Furthermore, the switches 42 (and diodes 44) can be made with Silicon (Si), Silicon Carbide (SiC), Gallium Nitride (GaN), or any suitable Wide Bandgap (WBG) material, with exemplary embodiments having the switches made of GaN or SiC.

Figure 2A:
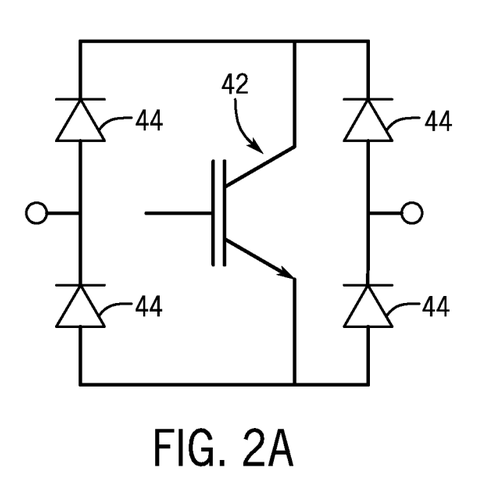
FIGS. 2A-2D are schematic diagrams of various solid-state switch and/or diode configurations and arrangements that may be implemented in the soft-starter of FIG. 1, according to embodiments of the invention
Figure 2B:
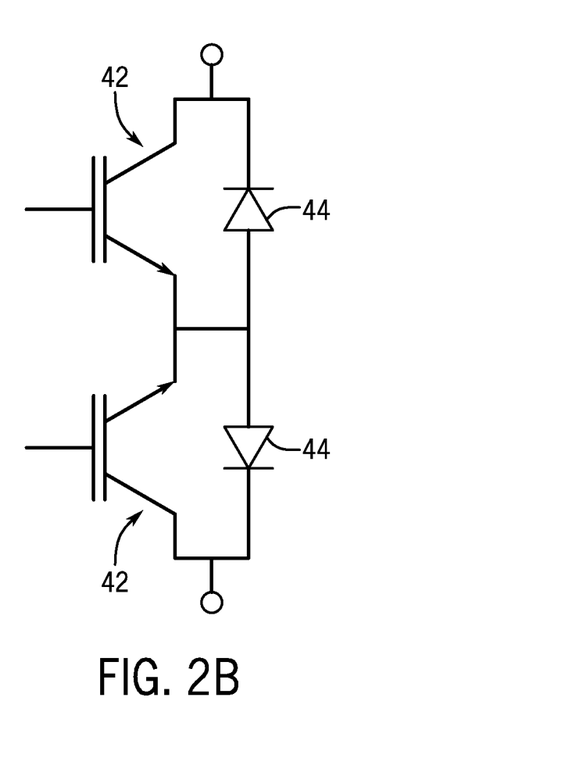
Figure 2C:
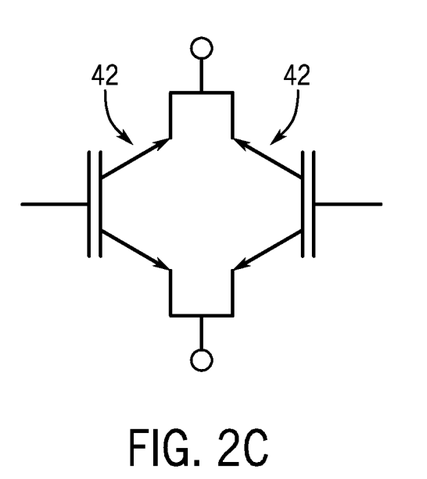
Figure 2D:
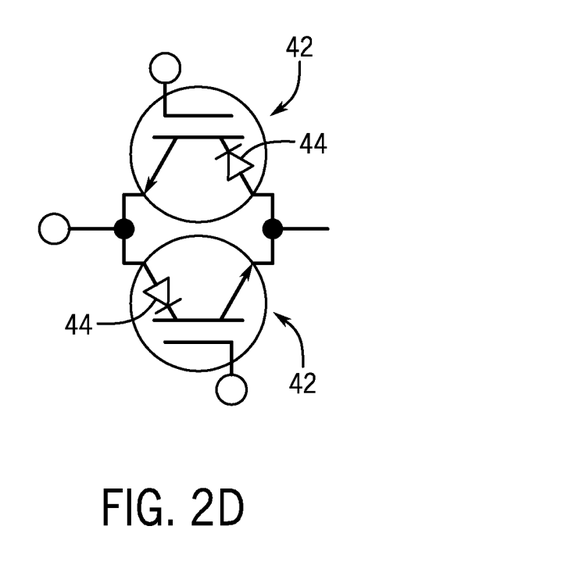

As further shown in FIG. 1, each of the IGBTs 42 in a respective switching block 22, 24, 26, 28, 30, 32 is arranged in anti-parallel with an associated diode 44. The IGBTs 42 in each switching block 22, 24, 26, 28, 30, 32 are further arranged and connected with one another in antiseries in a common collector (CC) configuration—referred to hereafter simply as "reverse-blocking IGBTs." The diodes 44 are arranged in opposing directions (i.e., antiseries) relative to one another, so as to block current flow in differing directions through the switching block 22, 24, 26, 28, 30, 32. Based on the arrangement of diodes 44 and reverse-blocking IGBTs 42, each switching block 22, 24, 26, 28, 30, 32 thus provides a bi-directional switching block that is able to control current and withstand voltage in both directions and allow for the selective interruption of current flow within soft-starter 20. With regard to the switching blocks 22, 24, 26, 28, 30, 32 illustrated in FIG. 1, it is noted that while the IGBTs 42 (and diodes 44) are shown therein as being connected in antiseries in a common collector configuration, IGBTs 42 and/or diodes 44 could instead be connected in other configurations while still providing the desired current controls and voltage protection. FIGS. 2A-2D illustrate alternate IGBT and diode arrangements/configurations that could be used as alternatives to the common collector configuration shown in FIG. 1. FIG. 2A shows a diode bridge configuration where a single IGBT 42 is arranged with four diodes 44. FIG. 2B shows IGBTs 42 connected in anti-series in a common emitter (CE) configuration, while still functioning as reverse-blocking IGBTs (with the orientation of each of diodes 44 then being flipped) able to control current and withstand voltage in both directions and allow for the selective interruption of current flow within soft-starter 20. FIG. 2C shows two IGBTs 42 arranged/connected in anti-parallel as a reverse blocking (RB) IGBT. FIG. 2D illustrates another reverse blocking (RB) IGBT arrangement where each IGBT 42 and diode 44 are integrated in one die, and two of such dies are connected as shown to control current and withstand voltage in both directions and allow for the selective interruption of current flow within soft-starter 20. Each of the above IGBT and diode arrangements provides distinct advantages and disadvantages, and thus the exact construction of each switching block 22, 24, 26, 28, 30, 32 can be determined based on the implementation of soft-starter 20 and the needs/requirements thereof.

In the embodiment shown in FIG. 1, additional protection and filtering devices accompany soft-starter 20. In the illustrated embodiment, a galvanic isolation disconnect switch 46 is provided that provides additional protection to the circuit, with the inclusion of disconnect switch 46 allowing the circuit 20 to meet the UL 489 standard, thereby enabling use of the circuit in service entrance, feeder, branch circuit, and other building applications, for example. Also included in the illustrated embodiment is a filter 48 (such as an electromagnetic interference (EMI) filter) connected between the input 34 and in-line switching blocks 22, 24, 26.

Also included in soft-starter 20 is a controller 50 configured to control switching of IGBTs of switching blocks 22, 24, 26, 28, 30, 32 via gate drive signals thereto. During operation (e.g., starting, stopping, etc.) of AC load 10, controller 50 functions to selectively cause each of IGBTs 42 to operate in an ON or OFF condition, so as to control the current flow (and therefore the voltage) applied to the AC load 10. In operation of soft-starter 20, the switching blocks 22, 24, 26, 28, 30, 32—and the IGBTs 42 therein—are selectively controlled by controller 50 to provide varied functionality that selectively controls current and voltage to the AC load 10. The selective switching of IGBTs 42 in the switching blocks 22, 24, 26, 28, 30, 32 provides for power controls in the form of: current and voltage control for soft-starting of the load 10, bi-directional power flow control through the soft-starter 20, pulse width modulation of power, and the ability to change load/motor speed. The selective switching of IGBTs 42 in the switching blocks 22, 24, 26, 28, 30, 32 also provides circuit breaker protection to the soft-starter 20 and feeder conductors, thereby removing the need for an external circuit breaker. Explanation of the operation of soft-starter 20 in different operating modes is set forth in more detail here-below.

According to one aspect of the invention, the controller 50 is programmed to control switching of IGBTs 42 in switching block 22, 24, 26 in order to implement current and voltage control for soft-starting of the motor. More specifically, controller 50 controls switching of IGBTs 42 in the in-line switching blocks 22, 24, 26 according to a switching algorithm, with the switching algorithm controlling switching of those IGBTs 42 to limit the transient voltages and currents to the AC load 10 during start-up. In controlling the switching of the IGBTs 42 in in-line switching blocks 22, 24, 26, the switching algorithm follows a switching logic that is based on the direction (or sign) of the current in all phases 14, 16, 18. According to one embodiment, a means to sense the current in at least two of the load terminals 38 is included in soft-starter 20, such as sensors 51 positioned on two or more of supply lines 14, 16, 18. Sensors 51 could also be configured to sense voltage on supply lines 14, 16, 18.

Figure 3:
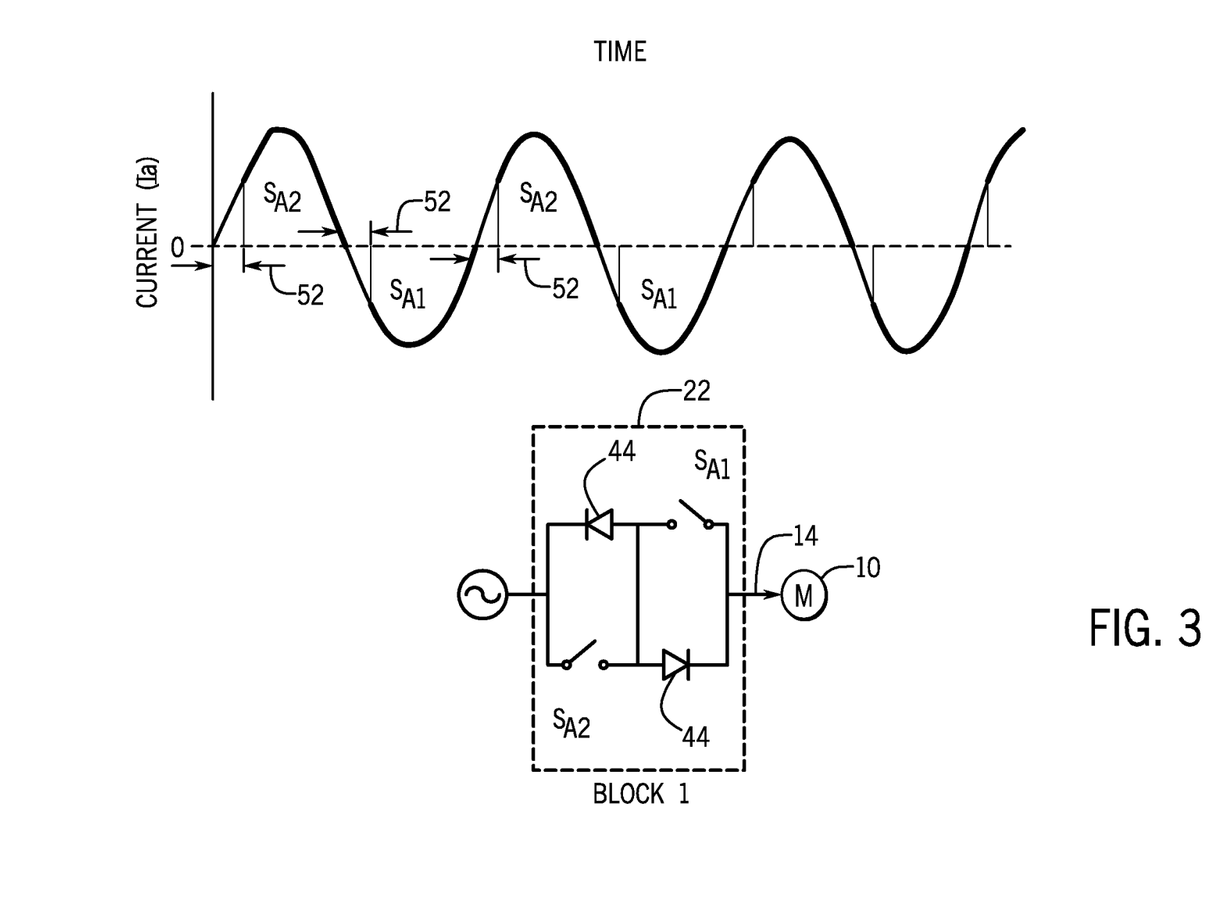
FIG. 3 is a graph illustrating the selective switching of solid-state switches of an in-line switching block in the soft-starter of FIG. 1 during positive and negative half-cycles of a current waveform, according to an embodiment of the invention.

Illustration of the switching of IGBTs 42—also identified as SA1, SA2—in the in-line switching block 22 for one phase of soft-starter 20 is illustrated in FIG. 3 for purposes of discussion, with it being shown therein that IGBTs SA1, SA2 are turned on and off during respective positive and negative half-cycles of current flow. In the illustrated mode of operation, IGBTs SA1, SA2 are fully On or fully Off, or they can be turned on with a time delay (i.e., no PWM thereof), and switching On and Off of the IGBTs SA1, SA2 after a zero-crossing is controlled and based on a level of a sensed closed-loop current and/or voltage, such as measured by sensors 51. That is, the level of a sensed current/voltage determines the length of a delay time, indicated at 52, before switching On/Off of the IGBTs SA1, SA2 after a zero-crossing, so as to achieve the soft-starting of the AC load 10—with the larger the sensed current, the longer the delay period in switching on the IGBTs SA1, SA2 during the respective positive and negative half-cycles.

Figure 4:
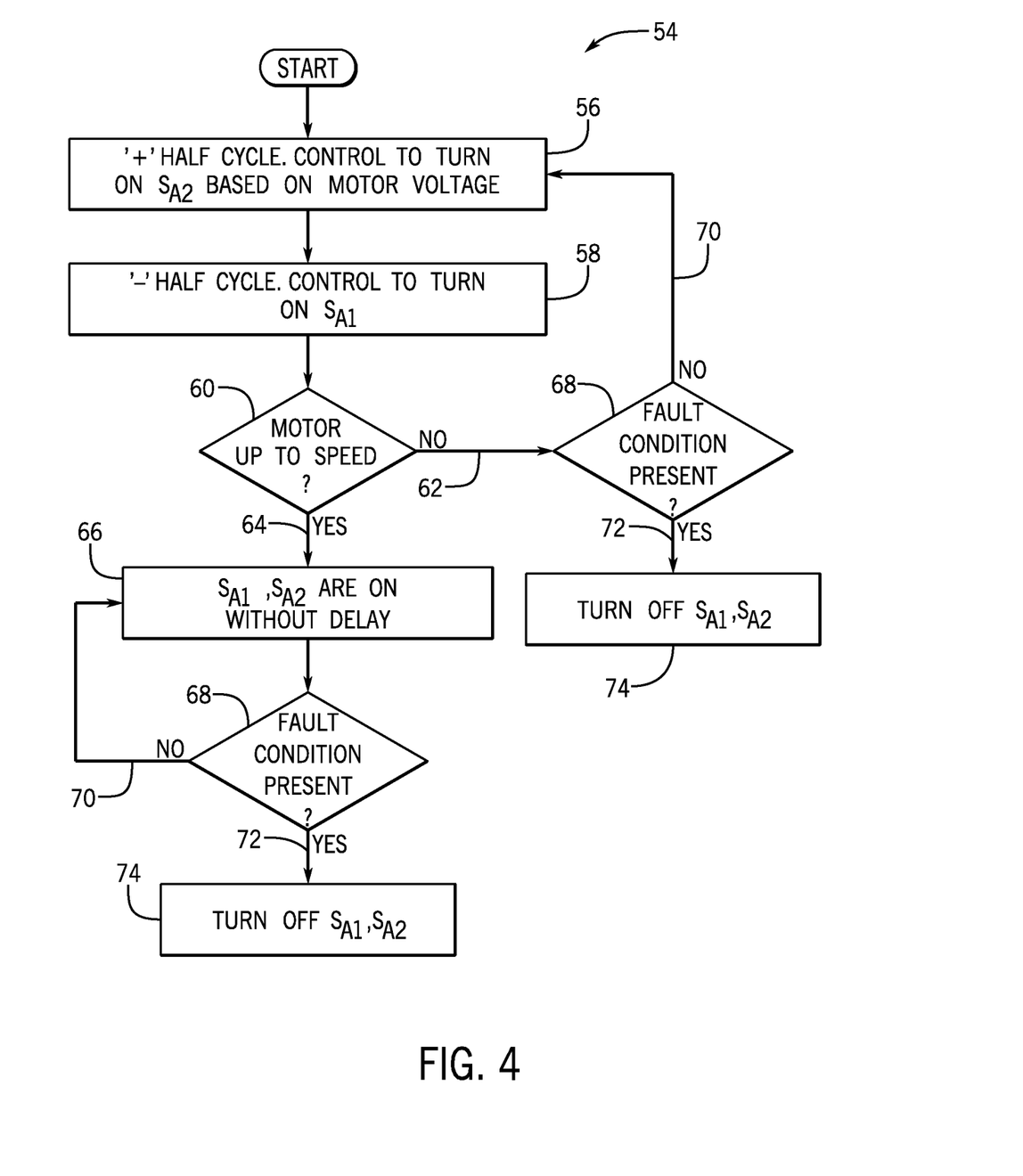
FIG. 4 is a flowchart illustrating a technique for controlling the solid-state switches of in-line switching blocks of the soft-starter of FIG. 1, according to an embodiment of the invention.

FIG. 4 illustrates a technique 54 for controlling switching IGBTs SA1, SA2 in the in-line switching blocks 22, 24, 26 during a soft-starting of AC motor 10, to provide further explanation of that which is shown in FIG. 3—with it being recognized that technique 54 would be implemented by controller 50, for example. As seen therein, technique 54 starts at STEP 56 with a controlled turn On of SA2 during a positive half-cycle of the current. As set forth above, the time at which SA2 is switched On after zero-crossing is determined based on the motor voltage and/or current. At STEP 58, a controlled turn On of SA1 is performed during a negative half-cycle of the current. Again, the time at which SA1 is switched On after zero-crossing is determined based on the motor voltage and/or current. When controlling switching of IGBTs SA1, SA2 during positive and negative half cycles, a determination is made as to whether the motor being driven is up to a desired operating speed, as indicated at STEP 60. If it is determined that the motor is not yet up to full speed, as indicated at 62, then it is identified that continued soft-starting of the motor is desired and the technique continues by looping back to STEPS 56, 58, where controlled turn On of IGBTs SA2 and SA1 during respective positive and negative half-cycles is continued. Conversely, if it is determined at STEP 60 that the motor is up to full speed, as indicated at 64, then technique continues at STEP 66 by switching On both SA1 and SA2 simultaneously and with no time delay—with the IGBTs SA1, SA2 therefore functioning as a bypass contactor when both turned On. That is, as the motor is operating at full speed, the soft-starting operation and associated switching scheme for SA1 and SA2 can be discontinued.

As further shown in FIG. 4, technique 54 also includes a step/steps where the soft-starter 20 is monitored for a fault condition. At STEP 68, a determination is made as to whether a fault condition is present in the soft-starter 20, with such a fault condition being an overload or over-current condition, for example. This determination can be made based on one or more sensed voltage and/or current readings acquired from soft-starter 20—including three phase input currents, a current across the IGBTs 42 of switching blocks, and/or three phase load output currents or voltages. These currents/voltages may be acquired by sensors 51 or by other sensing devices provided for soft-starter 20. In determining whether a fault condition is present, the voltage and/or current readings may be compared to one or more pre-determined current and/or voltage thresholds and, if any measured voltage/current has exceeded a pre-determined limit/threshold, a fault condition may be identified. As examples, current or voltage may be measured/determined across individual IGBTs 42 in soft-starter 20 and compared to a respective current threshold or the three-phase current may be compared to the input current rating of the soft-starter 20 to see if any of the phase currents exceeds a maximum allowable current value.

If it is determined at STEP 68 that no fault condition is present in the soft-starter 20, as indicated at 70, then technique continues with its present mode of operation—such as continuing to selectively control switching of SA1, SA2 for soft-starting of the motor (STEPS 56, 58) or operating the motor at full speed with SA1, SA2 fully On (STEP 66). However, if it is determined at STEP 68 that a fault condition is present in the soft-starter 20, as indicated at 72, then technique continues at STEP 74 by turning Off both SA1 and SA2. Upon switching of IGBTs SA1 and SA2 to the Off or non-conducting state, the in-line switching block 22 (along with blocks 24, 26) operates as a solid-state circuit breaker to block current flow therethrough and terminate current flow through the soft-starter 20.

Figure 5:
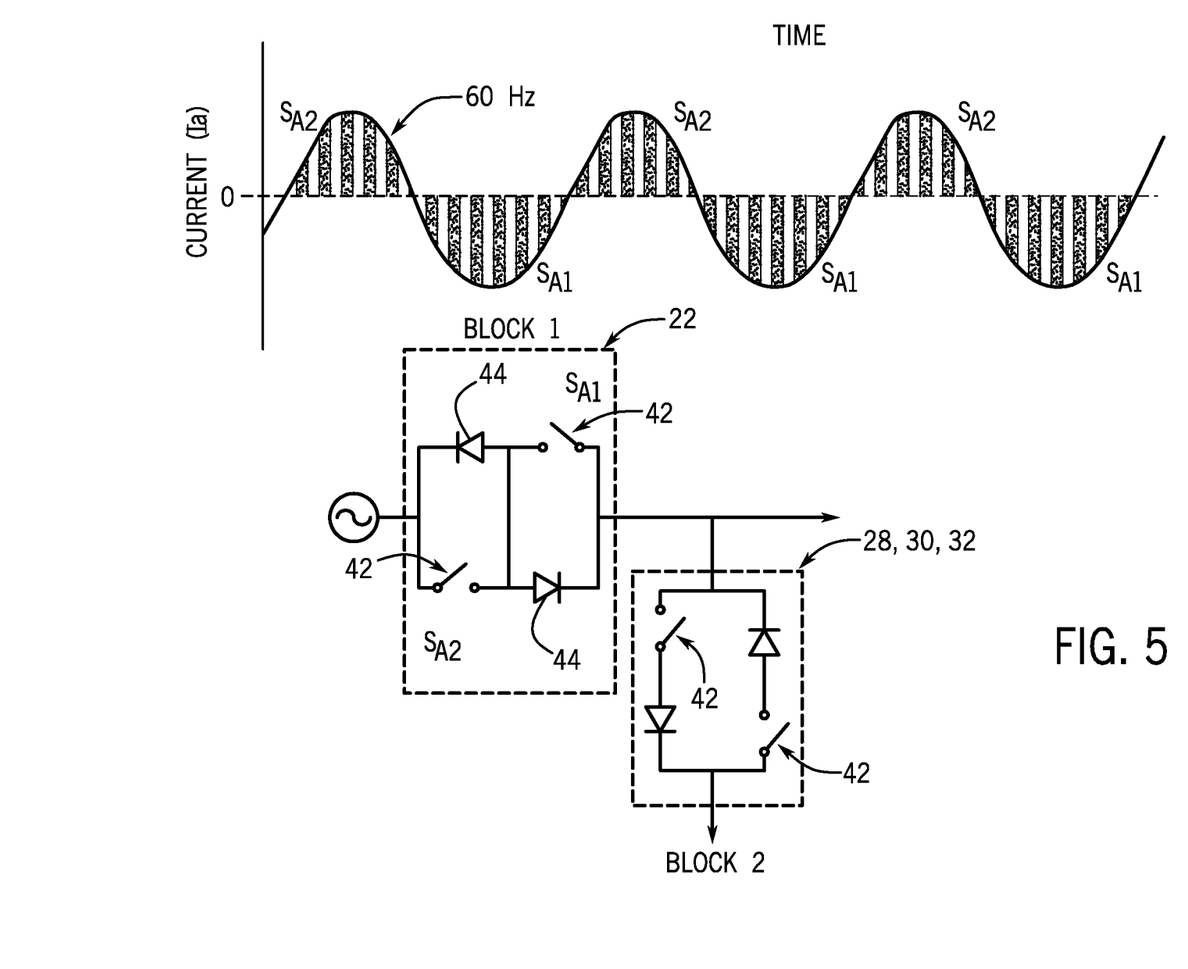
FIG. 5 is a graph illustrating the selective switching of solid-state switches of an in-line switching block in the soft-starter of FIG. 1 during positive and negative half-cycles of a current waveform with PWM, according to an embodiment of the invention.
Figure 6:
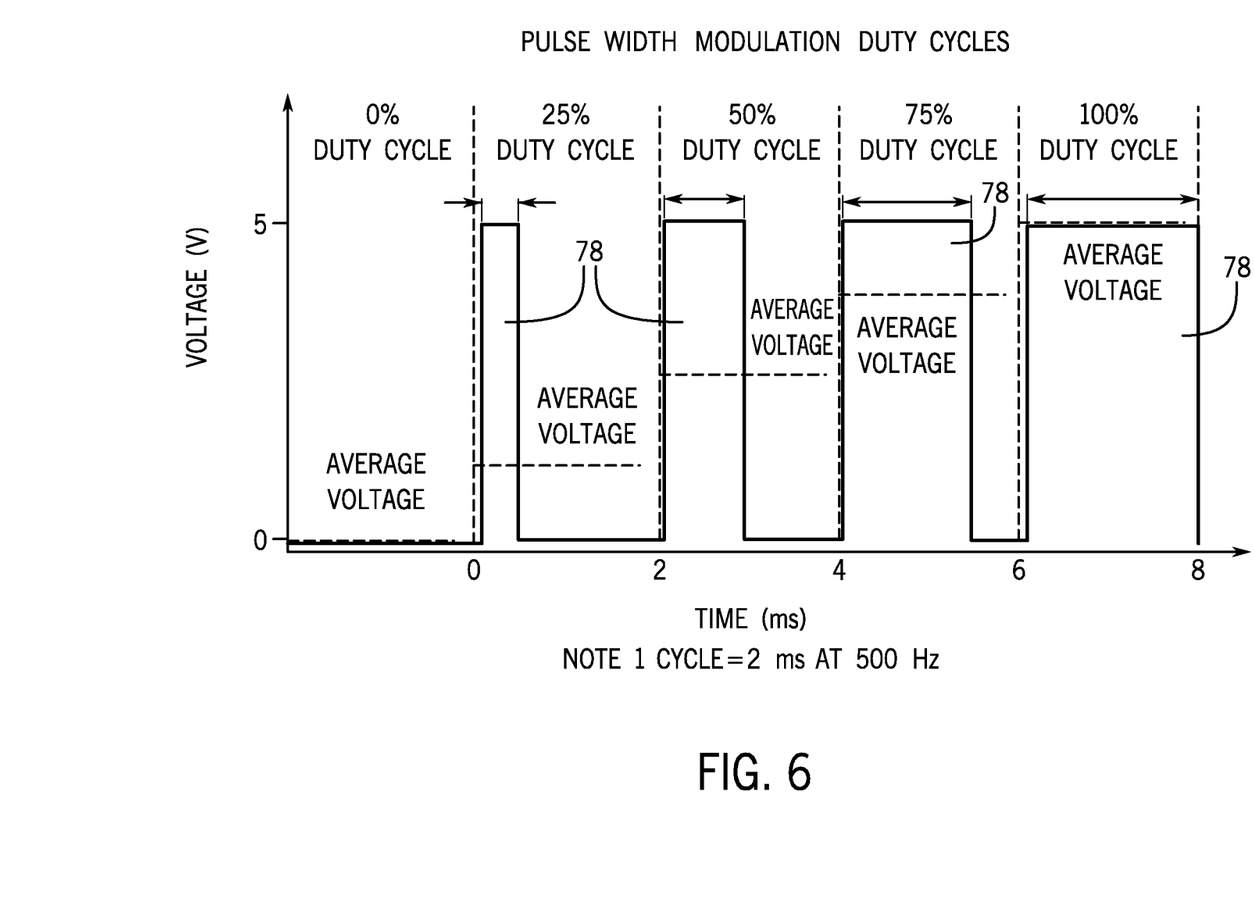
FIG. 6 is a graph illustrating the ramping-up of a duty cycle between 0% and 100% over time via the selective switching of solid-state switches of an in-line switching block of the soft-starter of FIG. 1, according to an embodiment of the invention.

According to another aspect of the invention, the controller 50 is programmed to control switching of IGBTs 42 in switching blocks 22, 24, 26, 28, 30, 32 in order to implement pulse width modulation (PWM) of the current for soft-starting of the AC motor 10. More specifically, controller 50 controls switching of IGBTs 42 in the in-line and free-wheeling switching blocks 22, 24, 26, 28, 30, 32 according to a switching algorithm, with the switching algorithm controlling switching of those IGBTs 42 to vary a duty cycle (i.e., ratio of an On period over the total of On/Off periods) and thereby ramp up the voltage to the AC load 10 during start-up. Descriptions and illustrations of the switching of IGBTs 42 in the in-line and free-wheeling switching blocks 22, 24, 26, 28, 30, 32 are further provided in FIGS. 5-7. FIG. 5 illustrates switching of IGBTs SA1, SA2 in the in-line switching block 22 for one phase of soft-starter 20, with it being shown therein that IGBTs SA1, SA2 are turned on and off during respective positive and negative half-cycles of current flow, with IGBTs SA1, SA2 being further switched On/Off at a high frequency with PWM. FIG. 6 illustrates that a duty cycle—indicated at 78, of SA1, SA2 is ramped-up over time—between 0% and 100%—to gradually increase the voltage to the AC load 10 during start-up.

Figure 7:
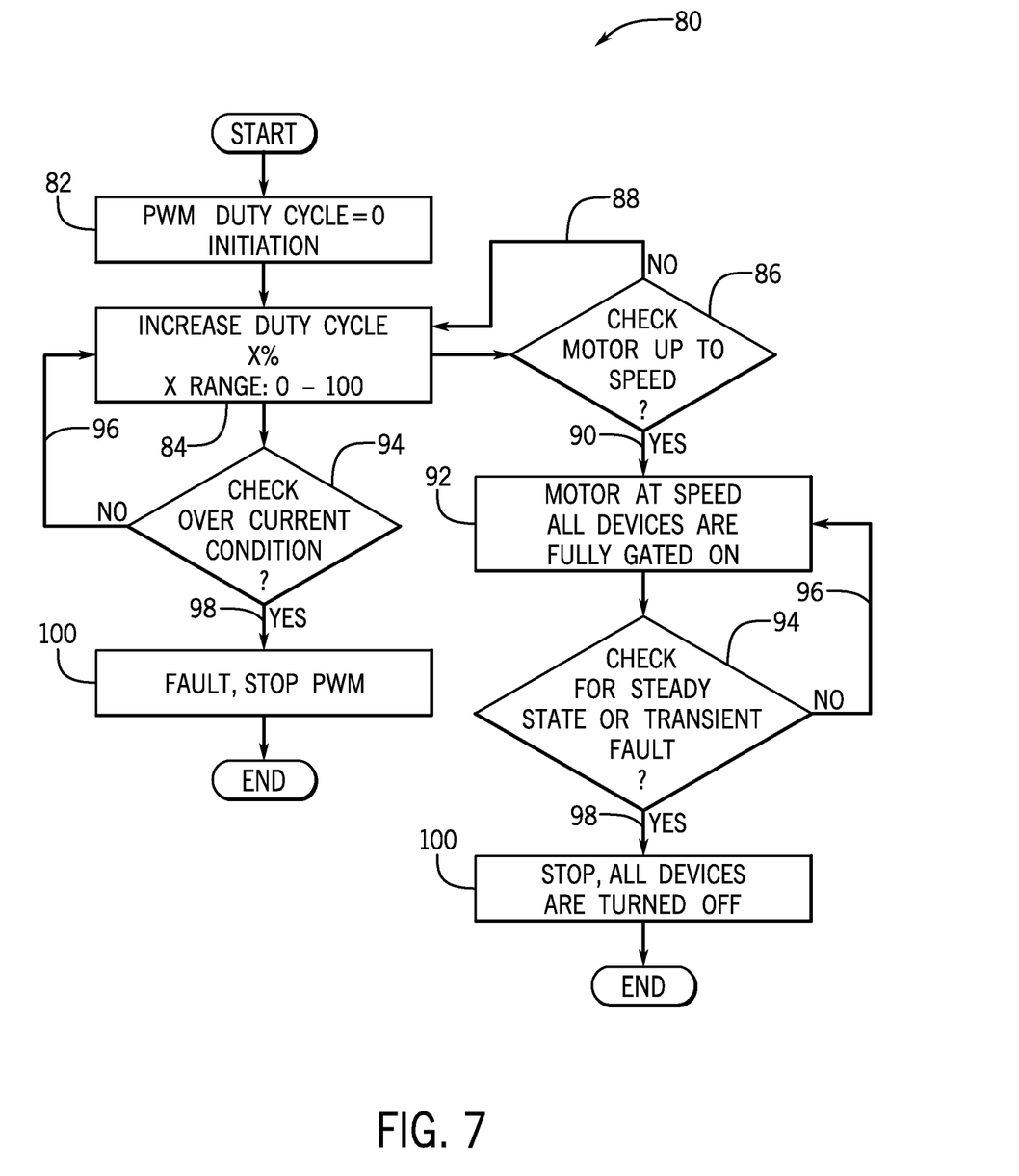
FIG. 7 is a flowchart illustrating a technique for controlling the solid-state switches of in-line switching blocks and free-wheeling switching blocks of the soft-starter of FIG. 1 to provide PWM, according to an embodiment of the invention.

Referring to FIG. 7, a technique 80 for controlling switching of IGBTs 42 in the in-line and free-wheeling switching blocks 22, 24, 26, 28, 30, 32 during a soft-starting of AC motor 10 is illustrated, to provide further explanation of that which is shown in FIGS. 5 and 6—with it being recognized that technique 80 would be implemented by controller 50, for example. As seen therein, technique 80 starts at STEP 82 with a controlled operation of IGBTs 42 in in-line switching blocks 22, 24, 26 with PWM that results in an initial 0% duty cycle. Technique 80 then proceeds to STEP 84, where the IGBTs 42 in in-line switching blocks 22, 24, 26 are controlled with PWM so as to increase the duty cycle from its initial/previous value, so as to gradually increase and ramp of the voltage to the AC load 10.

During STEP 84, IGBTs 42 in free-wheeling switching blocks 28, 30, 32 are selectively operated in the On condition such that a free-wheeling mode or period is entered. That is, during Off periods of the IGBTs 42 in in-line switching blocks 22, 24, 26 that are present in the PWM, IGBTs 42 in free-wheeling switching blocks 28, 30, 32 are selectively operated in the On condition to provide a continuous current flow to AC load 10. As an example, when IGBT SA2 in in-line switching block 22 is turned Off for a period, IGBTs SA4, SA3 in switching blocks 30, 32 (FIG. 1) are turned ON, so as to transition to a free-wheeling period where power from the AC source 12a, 12b, 12c is cut-off from the AC load 10 but current continues to circulate in the free-wheeling switching blocks 28, 30, 32. SA3 is On when phase A current flows into load 10 (positive current), and SA4 is On when phase A current flows from load to the free-wheeling circuit 28, 30, 32 (negative current). The ratio of the active period (wherein IGBTs 42 in the inline switching blocks 22, 24, 26 are On) over the sum of the active period and the free-wheeling period is referred to as the duty cycle, and is a key element in controlling the average voltage supplied to the AC load 10.

Referring still to FIG. 7, in a next step of technique 80 and upon an increasing of the duty cycle percentage based on controlled operation of IGBTs 42 in in-line switching blocks 22, 24, 26, a determination is made at STEP 86 as to whether the AC motor being driven is up to a desired operating speed. If it is determined that the AC motor 10 is not yet up to full speed, as indicated at 88, then it is identified that continued soft-starting of the motor is desired and the technique continues by looping back to STEP 84, where the duty cycle is increased from its previous value, so as to further ramp up the voltage to the AC load 10. Conversely, if it is determined at STEP 86 that the motor is up to full speed, as indicated at 90, then technique continues at STEP 92 by switching On (i.e., fully gating On) all IGBTs 42 in in-line switching blocks 22, 24, 26 simultaneously. That is, as the AC motor 10 is operating at full speed, the soft-starting operation and associated PWM can be discontinued.

As further shown in FIG. 7, technique 80 also includes steps where the soft-starter 20 is monitored for a fault condition, both during the PWM mode of operation and during operation of the motor at full speed. At STEP 94, a determination is made as to whether a fault condition is present in the soft-starter 20, with such a fault condition being an overload or over-current condition or another steady-state or transient fault condition, for example. This determination can be made based on one or more sensed voltage and/or current readings acquired from soft-starter 20—including three phase input currents, a current across the IGBTs of switching blocks, and/or three phase load output currents or voltages. These currents/voltages may be acquired by sensors 42 or by other sensing devices provided for soft-starter 20. If it is determined at STEP 94 that no fault condition is present in the soft-starter 20, as indicated at 96, then technique 80 continues with its present mode of operation, which as indicated above may be a PWM mode of operation or operation of the motor at full speed, and accordingly control the associated switching of IGBTs 42 in in-line switching blocks 22, 24, 26 and/or free-wheeling switching blocks 28, 30, 32. However, if it is determined at STEP 94 that a fault condition is present in the soft-starter 20, as indicated at 98, then technique continues by turning Off all IGBTs 42 in in-line switching blocks 22, 24, 26 and free-wheeling switching blocks 28, 30, 32 at STEP 100. Upon switching of IGBTs 42 to the Off or non-conducting state, the switching blocks 22, 24, 26, 28, 30, 32 operate as a solid-state circuit breaker to block current flow therethrough and terminate current flow through the soft-starter 20.

Figure 8:
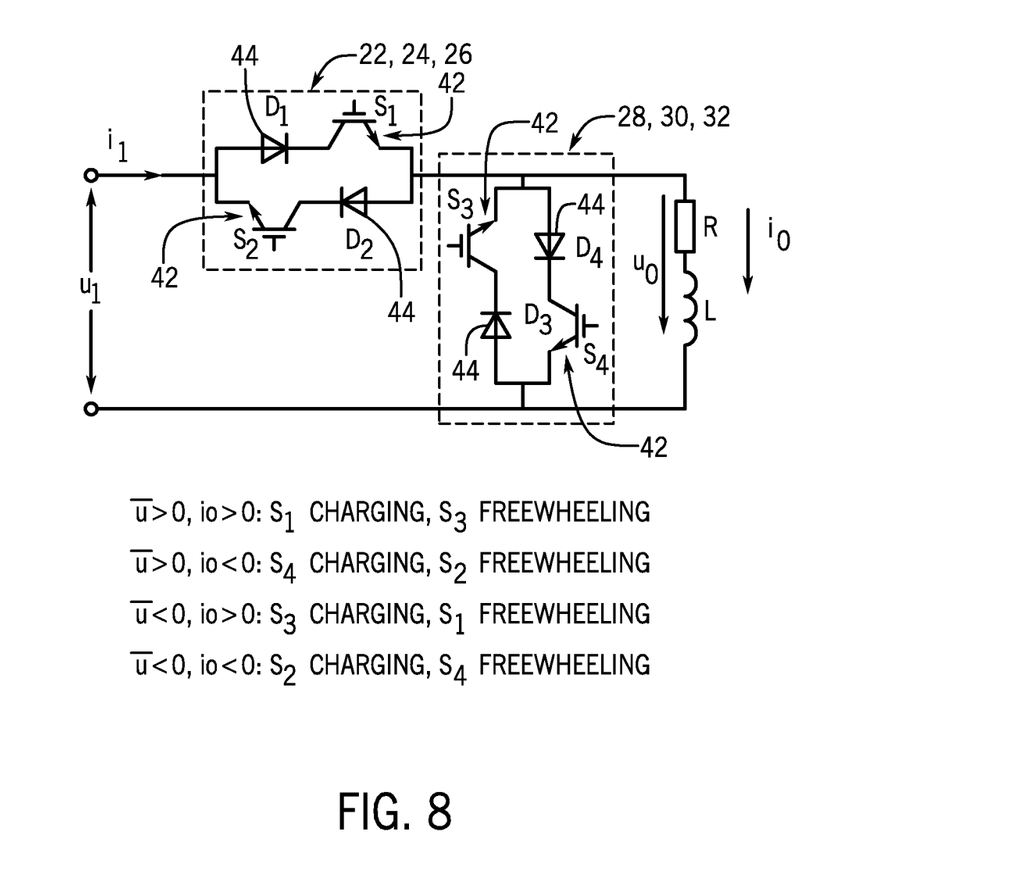
FIG. 8 is a schematic diagram of an in-line switching block and free-wheeling switching block in the soft-starter of FIG. 1, along with switching of solid-state switches therein during various current and voltage conditions thereof during operation, according to an embodiment of the invention.

With respect to the operating modes of soft-starter 20 shown and described in the techniques of FIGS. 4 and 7, it is recognized that switching blocks 22, 24, 26, 28, 30, 32 provide for a bi-directional power flow control through the soft-starter 20. Referring now to FIG. 8, operation of IGBTs 42 in an in-line switching block 22, 24, 26 and associated free-wheeling switching block 28, 30, 32 in the soft-starter 20 is described for such bi-directional power flow control, with it being recognized that each of switching blocks has 22, 24, 26, 28, 30, 32 a bidirectional control so as to provide for control of a flow of current through the soft-starter 20 in both a motoring mode of operation and in a regenerative mode of operation. That is, switching blocks 22, 24, 26, 28, 30, 32 control current as it flows from AC supply 12a, 12b, 12c to AC load 10 (defined as positive current) in the motoring mode and control current as it flows from AC load 10 to AC supply 12a, 12b, 12c (defined as negative current) in the regenerative mode.

As shown in FIG. 8, in a first operating condition where a positive current $i_1$ and positive line-to-line $u_1$ voltage are present, IGBT 51 in in-line switching block 22, 24, 26 is in a charging mode of operation and is thus selectively switched On according to a desired PWM scheme, while IGBT S3 in free-wheeling switching block 28, 30, 32 is in a free-wheeling mode of operation and is thus selectively switched On during an Off period of IGBT 51. In a second operating condition where negative current $i_1$ and positive line-to-line voltage $u_1$ are present, IGBT S4 in free-wheeling switching block 28, 30, 32 is in a charging mode of operation and is thus selectively switched On according to a desired PWM scheme, while IGBT S2 in in-line switching block 22, 24, 26 is in a free-wheeling mode of operation and is thus selectively switched On during an Off period of IGBT S4. In a third operating condition where negative current $i_1$ and negative line-to-line voltage $u_1$ are present, IGBT S2 in in-line switching block 22, 24, 26 is in a charging mode of operation and is thus selectively switched On according to a desired PWM scheme, while IGBT S4 in free-wheeling switching block 28, 30, 32 is in a free-wheeling mode of operation and is thus selectively switched On during an Off period of IGBT S2. In a fourth operating condition where a positive current $i_1$ and negative line-to-line voltage $u_1$ are present, IGBT S3 in free-wheeling switching block 28, 30, 32 is in a charging mode of operation and is thus selectively switched On according to a desired PWM scheme, while IGBT S1 in in-line switching block 22, 24, 26 is in a free-wheeling mode of operation and is thus selectively switched On during an Off period of IGBT S3.

Figure 9:
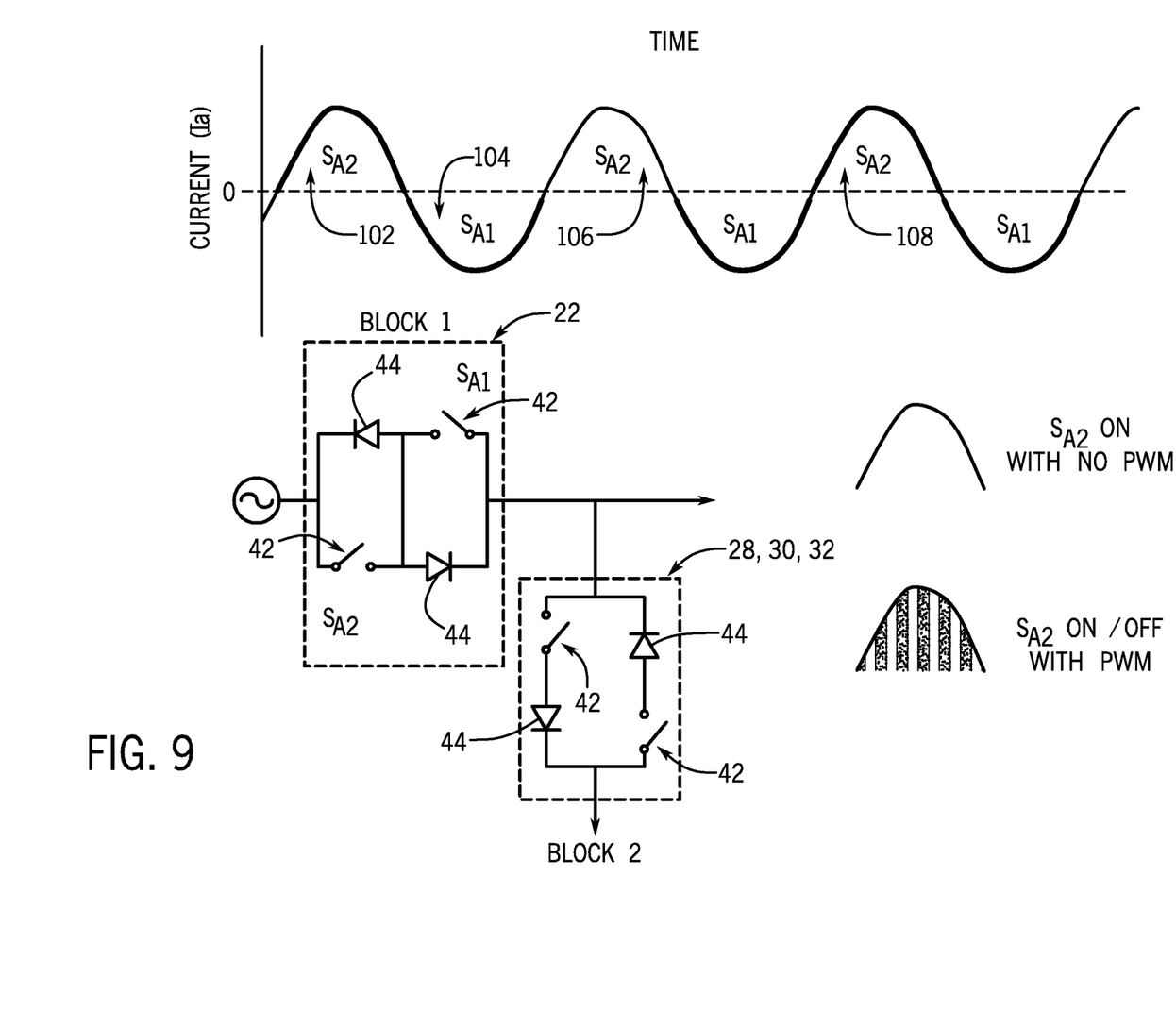
FIG. 9 is a graph illustrating the selective switching of solid-state switches of an in-line switching block in the soft-starter of FIG. 1 during positive and negative half-cycles of a current waveform to provide variable speed operation of a motor, according to an embodiment of the invention.

According to yet another aspect of the invention, the controller 50 is programmed to control switching of IGBTs 42 in switching blocks in order to provide a soft-starter 20 that allows for operation of the AC load 10 at variable speeds. More specifically, controller 50 controls switching of IGBTs 42 in the in-line switching blocks 22, 24, 26 according to a switching algorithm, with the switching algorithm controlling switching of those IGBTs 42 to control a frequency of the output power of the soft-starter 20, so as to provide for operation of the AC load 10 at variable speeds. Illustration of the switching of IGBTs SA1, SA2 in the in-line switching block 22 for one phase of soft-starter 20 is illustrated in FIG. 9 for purposes of discussion, with it being shown therein that IGBTs SA1, SA2 are turned On and Off during respective positive and negative half-cycles of current flow. More specifically, controller 50 may control switching of IGBTs SA1, SA2 such that one or more of SA1, SA2 may be left Off during a positive or negative half-cycle where the respective IGBT would normally be left on. For example, as illustrated in FIG. 9, SA2 may be switched On after a zero-crossing and during a first positive half-cycle 102, switched Off after a zero-crossing and during a first negative half-cycle 104, left Off after a zero-crossing and during a second positive half-cycle 106, and then turned back On after a zero-crossing and during a third positive half-cycle 108. SA1 may be similarly controlled such that it is left Off during selective negative half-cycles. In this manner, and based on the number of half-cycles where SA1 and SA2 are selectively left Off (where they would typically be turned On), the output frequency of the soft-starter 20 may be selectively controlled and reduced—with such reductions being implemented at finer intervals than can be provided with existing speed reduction techniques in soft-starters.

With regard to the switching of IGBTs SA1, SA2 in the in-line switching block 22 illustrated in FIG. 9 to provide for variable speed operation of the motor 10, it is recognized that such switching may be implemented with no PWM (FIGS. 3, 7) or with PWM (FIGS. 5, 7), according to embodiments of the invention. Where no PWM is implemented, variable speed operation of the motor 10 may be accomplished via controlled switching of IGBTs 42 in in-line switching blocks 22, 24, 26 only, with it being recognized that firing angles of the IGBTs 42 may be controlled similar to control/operation of SCRs in standard soft-starters. Where PWM is implemented, variable speed operation of the motor 10 may be accomplished via controlled switching of IGBTs 42 in in-line switching blocks 22, 24, 26 and controlled switching of IGBTs 42 in free-wheeling switching blocks 28, 30, 32. In either case, IGBTs 42 in switching blocks 22, 24, 26, 28, 30, 32 are selectively controlled during soft-starting of the motor and during operation of the motor 10 at a desired speed, so as to provide controlled voltage and current to the motor, with the IGBTs 42 also being selectively controlled to provide circuit breaker protection to soft-starter 20 upon occurrence of a fault condition, as previously described for the techniques 54, 80 illustrated in FIGS. 4 and 7.

Beneficially, embodiments of the invention thus provide an AC-AC power converter, such as a soft-starter, having circuit breaker capability and functionality built-in thereto to protection against overcurrent or other transient or steady-state fault condition that might be present in the power converter. The incorporation of a solid-state circuit breaker into the AC-AC power converter thus provides an effective solution to limit damage to the AC-AC power converter from high current faults of up to 100 kA or more, for example. The arrangement of solid-state switches that provides the circuit breaker capability also provides for power control functionality in the form of: current and voltage output control for soft-starting of the load, bi-directional power flow control through the soft-starter, pulse width modulation of output power, and the ability to change/vary motor speed.

Therefore, according to one embodiment of the present invention, an AC-AC power converter includes an input connectable to line terminals of an AC source, an output connectable to load terminals of an AC load, and one or more supply lines connecting the input and output to transmit power from the AC source to the AC load, each supply line corresponding to a phase in the AC load. The AC-AC power converter also includes a plurality of in-line solid-state switching blocks connected between the line terminals and the load terminals, such that each supply line includes a respective one of the plurality of in-line solid-state switching blocks connected thereto, and a plurality of free-wheeling solid-state switching blocks connected to the load terminals at one end and together at a common connection at another end, such that each supply line includes a respective one of the plurality of free-wheeling solid-state switching blocks connected thereto, wherein each of the plurality of in-line solid-state switching blocks and each of the plurality of free-wheeling solid-state switching blocks comprises a bi-directional switching block that selectively controls current and withstands voltage in both directions.

According to another embodiment of the present invention, an AC-AC power converter includes an input connectable to line terminals of an AC source, an output connectable to load terminals of an AC load, and one or more supply lines connecting the input and output to transmit power from the AC source to the AC load, each supply line corresponding to a phase in the AC load. The AC-AC power converter also includes a plurality of solid-state switching blocks each including an arrangement of solid-state switches, with or without accompanying diodes, that form a bi-directional switching block that controls current and withstands voltage in both directions. The AC-AC power converter further includes a controller operatively connected to each of the plurality of solid-state switching blocks, the controller programmed to selectively switch the solid-state switches in the plurality of solid-state switching blocks between conducting and non-conducting states to enable full speed operation of the AC load, soft-starting of the AC load at a voltage less than a full speed operation voltage, and selective interruption of current flow through the AC-AC power converter in a circuit breaker function.

According to yet another embodiment of the present invention, a method of operating an AC-AC power converter includes receiving an AC power at an input of the AC-AC power converter and comparing, via a controller, one or more current and voltage parameters of power provided to the AC-AC power converter or present in the AC-AC power converter and acquired by one or more voltage or current sensors, to one or more respective current and voltage thresholds. The method also includes identifying, via the controller, a fault condition in the AC-AC power converter if the one or more measured or determined current and voltage parameters exceed the one or more respective current and voltage thresholds and controlling, via the controller, a solid-state circuit breaker integrated into the AC-AC power converter to interrupt current flow through the AC-AC power converter upon identification of the fault condition, the solid-state circuit breaker comprising a plurality of solid-state switching blocks connected between line terminals and load terminals of the AC-AC power converter, with each of the solid-state switching blocks including a pair of solid-state switches connected with one another in anti-series and a pair of diodes each connected in anti-parallel with the pair of solid-state switches, with the pair of diodes further connected in anti-series with one another. In controlling the solid-state circuit breaker to interrupt current flow, the method further includes switching each of the pair of solid-state switches in each respective solid-state switching block to a non-conducting Off state, so as to interrupt current flow through the AC-AC power converter.

The present invention has been described in terms of the preferred embodiment, and it is recognized that equivalents, alternatives, and modifications, aside from those expressly stated, are possible and within the scope of the appending claims.

What is claimed is:

1. An AC-AC power converter comprising:
    an input connectable to a line terminal of an AC source;
    an output connectable to a load terminal of an AC load;
    one or more supply lines connecting the input and output to transmit power from the AC source to the AC load, each supply line corresponding to a phase in the AC load; and
    a solid-state circuit breaker integrated into the AC-AC power converter to provide a circuit breaking capability by interrupting current flow through the AC-AC power converter upon identification of a fault condition, the solid-state circuit breaker comprising a plurality of solid-state switching blocks connected between line terminals and load terminals of the AC-AC power converter, the plurality of solid-state switching blocks comprising:
        a plurality of in-line solid-state switching blocks connected between the line terminal and the load terminal, such that each supply line includes only a single in-line solid-state switching block of the plurality of in-line solid-state switching blocks connected thereto; and
        a plurality of free-wheeling solid-state switching blocks connected to the load terminal at one end and together at a common connection at another end, such that each supply line includes only a single free-wheeling solid-state switching block of the plurality of free-wheeling solid-state switching blocks connected thereto;
        wherein each of the plurality of in-line solid-state switching blocks and each of the plurality of free-wheeling solid-state switching blocks comprises a bi-directional switching block that selectively controls current and withstands voltage in both directions; and
        wherein each of the plurality of in-line solid-state switching blocks and each of the plurality of free-wheeling solid-state switching blocks comprises:
            a first solid-state switch operable in a conducting state and a non-conducting state;
            a first diode in anti-parallel with the first solid-state switch:
            a second solid-state switch operable in a conducting state and a non-conducting state, the second solid-state switch arranged in anti-series relative to the first solid-state switch; and
            a second diode in anti-parallel with the second solid-state switch and providing current blocking in an opposite direction from the first diode.

2. The AC-AC power converter of claim 1 further comprising a controller operably connected to the plurality of in-line solid-state switching blocks, the controller programmed to:
    identify the fault condition in the AC-AC power converter based on one or more of voltage values and current values received thereby; and
    switch the first and second solid-state switches to the non-conducting state upon identification of the fault condition, so as to interrupt current flow through the in-line solid-state switching blocks and provide the circuit breaking capability of the solid-state circuit breaker in the AC-AC power converter.

3. The AC-AC power converter of claim 2 wherein the controller is further programmed to control switching of the first and second solid-state switches in each of the plurality of in-line solid-state switching blocks to control a current flow output from the AC-AC converter, so as to provide a soft-starting of the AC load.

4. The AC-AC power converter of claim 3 wherein the controller is further programmed to:
    operate the second solid-state switch in the conducting state and the first solid-state switch in the non-conducting state during a positive current half cycle;
    operate the first solid-state switch in the conducting state and the second solid-state switch in the non-conducting state during a negative current half cycle.

5. The AC-AC power converter of claim 4 wherein the controller is further programmed to delay a switching of the first and second solid-state switches from the non-conducting state to the conducting state for a period after a zero current crossing based on a closed-loop current value in the AC-AC power converter, so as to control a duty cycle of the AC-AC power converter.

6. The AC-AC power converter of claim 4 wherein the controller is further programmed to control switching of the first and second solid-state switches in each of the plurality of in-line solid-state switching blocks and each of the plurality of free-wheeling solid-state switching blocks to perform a pulse width modulation (PWM) of the power from the AC source, with the controller being programmed to:
    switch the first and second solid-state switches in the plurality of in-line solid-state switching blocks between the non-conducting state and the conducting state at a desired frequency during the respective positive or negative current half cycle during which the switches are in the conducting state; and
    selectively operate the first and second solid-state switches of the plurality of free-wheeling solid-state switching blocks in the conducting state while the first and second solid-state switches in the plurality of in-line solid-state switching blocks are in the non-conducting state, so as to provide a continuous current flow to the AC load.

7. The AC-AC power converter of claim 4 wherein the controller is further programmed to:
    selectively operate the second solid-state switch in the non-conducting state during a positive current half cycle, rather than its normal conducting state during positive current half cycles; and
    selectively operate the first solid-state switch in the non-conducting state during a negative current half cycle, rather than its normal conducting state during negative current half cycles;
    wherein the selective operation of the second solid-state switch in the non-conducting state during the respective positive current half cycle and the selective operation of the first solid-state switch in the non-conducting state during the respective negative current half cycle provides for variable speed operation of the AC load via the AC-AC power converter.

8. The AC-AC power converter of claim 2 wherein the controller is further programmed to fully gate the first and second solid-state switches in each of the plurality of in-line solid-state switching blocks to the conducting state upon the AC load reaching a full operating speed, such that the first and second solid-state switches function as a bypass contactor.

9. The AC-AC power converter of claim 2 wherein the first and second solid-state switches comprise one of insulated-gate bipolar transistor (IGBTs), metal oxide semiconductor field effect transistors (MOSFETs), or integrated gate-commutated thyristors (IGCTs), and wherein the first and second solid-state switches and/or diodes are composed of a Wide Bandgap (WBG) material comprising Silicon (Si), Silicon Carbide (SiC), or Gallium Nitride (GaN).

10. The AC-AC power converter of claim 1 wherein each of the first and second solid-state switches of each of the plurality of in-line solid-state switching blocks and each of the plurality of free-wheeling solid-state switching blocks comprises a reverse blocking insulated-gate bipolar transistor (RB-IGBTs).

11. The AC-AC power converter of claim 1 further comprising a galvanic isolation disconnect switch located between the input and the plurality of in-line solid-state switching blocks, such that the AC-AC power converter meets standard UL489.

12. An AC-AC power converter comprising:
an input connectable to a line terminal of an AC source;
an output connectable to a load terminal of an AC load;
one or more supply lines connecting the input and output to transmit power from the AC source to the AC load, each supply line corresponding to a phase in the AC load;
a plurality of solid-state switching blocks each including an arrangement of solid-state switches, with or without accompanying diodes, that form a bi-directional switching block that controls current and withstands voltage in both directions; and
a controller operatively connected to each of the plurality of solid-state switching blocks, the controller programmed to selectively switch the solid-state switches in the plurality of solid-state switching blocks between conducting and non-conducting states to enable full speed operation of the AC load, soft-starting of the AC load at a voltage less than a full speed operation voltage, and selective interruption of current flow through the AC-AC power converter in a solid-state circuit breaker function;
wherein the plurality of solid-state switching blocks comprises:
in-line switching blocks connected between the input and the output of the AC-AC power converter, such that each supply line includes only one of the plurality of in-line solid-state switching blocks connected thereto; and
free-wheeling switching blocks connected to the output of the AC-AC converter at one end and together at a common connection at another end, such that each supply line includes only one of the plurality of free-wheeling solid-state switching blocks connected thereto; and wherein the controller is programmed to selectively interrupt current flow through the AC-AC power converter in the solid-state circuit breaker function by:
identifying a fault condition in the AC-AC power converter based on one or more of voltage values and current values received thereby; and
switching each solid-state switch in the arrangement of solid-state switches in the in-line switching blocks to the non-conducting state, so as to interrupt current flow through the in-line solid-state switching blocks.

13. The AC-AC power converter of claim 12 wherein the controller is programmed to switch each solid-state switch in the arrangement of solid-state switches in the in-line switching blocks to the conducting state, in a fully gated-on condition, upon the AC load reaching full operating speed.

14. The AC-AC power converter of claim 12 wherein each of the in-line switching blocks and each of the free-wheeling switching blocks comprises:
a first solid-state switch and a second solid-state switch connected with one another in anti-series; and
a pair of diodes each connected in anti-parallel with a respective one of the first solid-state switch and the second solid-state switch, with the pair of diodes further connected in anti-series with one another.

15. The AC-AC power converter of claim 14 wherein the controller is programmed to:
operate the second solid-state switch in the conducting state and the first solid-state switch in the non-conducting state during a positive current half cycle in the in-line switching blocks;
operate the first solid-state switch in the conducting state and the second solid-state switch in the non-conducting state during a negative current half cycle in the in-line switching blocks; and
implement one of:
a delay in switching the first and second solid-state switches in the in-line switching blocks from the non-conducting state to the conducting state after a zero current crossing based on a closed-loop current value in the AC-AC power converter, so as to provide a soft-starting of the AC load, with the respective one of the first and second solid-state switches that is turned On with a delay being turned Off at the next zero current crossing of that phase, at the end of each half cycle; or
a pulse width modulation (PWM) scheme for switching of the first and second solid-state switches in the in-line switching blocks between the non-conducting state and the conducting state at a desired frequency during a respective positive or negative current half cycle during which the switches are in the conducting state;
wherein, during implementation of the PWM scheme, the controller is further programmed to selectively operate the first and second solid-state switches in the plurality of free-wheeling solid-state switching blocks in the conducting state while the first and second solid-state switches in the plurality of in-line solid-state switching blocks are in the non-conducting state, so as to provide a continuous current flow to the AC load.

16. The AC-AC power converter of claim 14 wherein the controller is programmed to:
selectively operate the second solid-state switch of the in-line switching blocks in the non-conducting state during a respective positive current half cycle, rather than its normal conducting state during positive current half cycles; and selectively operate the first solid-state switch of the in-line switching blocks in the non-conducting state during a respective negative current half cycle, rather than its normal conducting state during negative current half cycles;

wherein the selective operation of the second solid-state switch in the non-conducting state during a respective positive current half cycle and the selective operation of the first solid-state switch in the non-conducting state during a respective negative current half cycle provides for variable speed operation of the AC load.

17. A method of operating an AC-AC power converter, the method comprising:
- receiving an AC power at an input of the AC-AC power converter;
- comparing, via a controller, one or more current and voltage parameters of power provided to the AC-AC power converter or present in the AC-AC power converter and acquired by one or more voltage or current sensors, to one or more respective current and voltage thresholds;
- identifying, via the controller, a fault condition in the AC-AC power converter if the one or more measured or determined current and voltage parameters exceed the one or more respective current and voltage thresholds; and
- controlling, via the controller, a solid-state circuit breaker integrated into the AC-AC power converter to interrupt current flow through the AC-AC power converter upon identification of the fault condition, the solid-state circuit breaker comprising a plurality of solid-state switching blocks connected between line terminals and load terminals of the AC-AC power converter, with each of the solid-state switching blocks including:
  - a pair of solid-state switches connected with one another in anti-series; and
  - a pair of diodes each connected in anti-parallel with the pair of solid-state switches, with the pair of diodes further connected in anti-series with one another;

wherein controlling the solid-state circuit breaker to interrupt current flow comprises switching each of the pair of solid-state switches in each respective solid-state switching block to a non-conducting Off state, so as to interrupt current flow through the AC-AC power converter; and wherein the plurality of solid-state switching blocks comprises:
- in-line switching blocks connected between the line terminals and the load terminals, such that each supply line includes only one of the plurality of in-line solid-state switching blocks connected thereto; and
- free-wheeling switching blocks connected to the load terminals at one end and together at a common connection at another end, such that each supply line includes only one of the plurality of free-wheeling solid-state switching blocks connected thereto.

* * * * *